(12) United States Patent
Ryu et al.

(10) Patent No.: US 6,548,862 B2
(45) Date of Patent: Apr. 15, 2003

(54) STRUCTURE OF SEMICONDUCTOR DEVICE AND METHOD FOR MANUFACTURING THE SAME

(75) Inventors: Hyuk-ju Ryu, Kuri (KR); Jong-hyon Ahn, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/144,962

(22) Filed: May 14, 2002

(65) Prior Publication Data

US 2003/0030103 A1 Feb. 13, 2003

(30) Foreign Application Priority Data

Aug. 4, 2001 (KR) .......................... 2001-47148

(51) Int. Cl.⁷ .................. H01L 31/062; H01L 31/119
(52) U.S. Cl. .................. 257/331; 257/366; 257/365; 257/319
(58) Field of Search .................. 257/331, 366, 257/365, 29.111, 29.134, 319, 334

(56) References Cited

U.S. PATENT DOCUMENTS

| 5,120,673 | A | * | 6/1992 | Itoh .............................. 438/304 |
| 5,843,815 | A | * | 12/1998 | Liaw ........................... 438/238 |
| 6,078,082 | A | * | 6/2000 | Bulucea ....................... 257/345 |
| 6,168,995 | B1 | * | 1/2001 | Kelly et al. .................. 438/266 |
| 6,274,906 | B1 | * | 8/2001 | Kim et al. .................... 257/336 |
| 6,426,535 | B1 | * | 7/2002 | Takeuchi et al. ............ 257/408 |

* cited by examiner

Primary Examiner—Jasmine J B Clark
(74) Attorney, Agent, or Firm—Mills & Onello LLP

(57) ABSTRACT

A semiconductor device and a method for manufacturing the same are provided. The structure of a semiconductor device includes gate electrodes having a T-shaped structure comprised of first and second gate electrodes having low gate resistance and low parasitic capacitance and a halo ion-implanted region in which a short channel effect can be effectively suppressed. The method for manufacturing the device is capable of performing high angle ion implantation without extending gate-to-gate space.

15 Claims, 7 Drawing Sheets

STRUCTURE OF SEMICONDUCTOR DEVICE AND METHOD FOR MANUFACTURING THE SAME

BACKGROUND OF THE INVENTION

1. Field of the Invention

The present invention relates to a structure of a semiconductor device and a method for manufacturing the same, and more particularly, to a structure of a semiconductor device including gate electrodes having a T-shaped structure comprised of first and second gate electrodes having low gate resistance and low parasitic capacitance and a halo ion-implanted region in which a short channel effect can be effectively suppressed, and a method for manufacturing the same capable of performing high angle ion implantation without extending gate-to-gate space.

2. Description of the Related Art

In semiconductor devices employing a MOS transistor, critical dimension (CD) of the gate electrode has many effects on the properties of the MOS transistor. As semiconductor devices become highly integrated, the CD of the gate electrode becomes smaller. As a result, a method for forming a shallow junction is used so as to improve a short channel effect caused by scale down of the MOS transistor. However, this has limitations in reducing resistance of a source/drain extension region. As an alternative to this, halo ion implantation has been suggested. However, as the CD of the gate electrode becomes much smaller, the concentration of halo ion implantation becomes higher, resulting in an increase in junction capacitance and junction leakage current, and a decrease in on-current. High angle ion implantation has been suggested to solve these problems.

High angle ion implantation is a method for selectively implanting impurity ions into the sides of source/drain extension regions by using a high angle during ion implantation to form a halo ion-implanted region, and effectively prevents a short channel effect even though impurity ions with low concentration are implanted into the sides of the source/drain extension regions. When the concentration of the impurities in the halo ion-implanted region is reduced, a body effect is reduced, thereby increasing on-current and reducing off-current. Further, the high angle halo ion implantation causes a decrease in junction capacitance and a decrease in variation in gate length. However, as semiconductor devices become highly integrated, due to limitations in gate-to-gate space, halo ion implantation having more than a predetermined angle is impossible, and thus, the advantages of the high angle halo ion implantation cannot be realized. That is, as previously described, the high angle halo ion implantation is essentially used to manufacture a high performance transistor. However, due to adjacent gate electrodes, a shadowing effect occurs during ion implantation, and thus, the high angle halo ion implantation cannot be performed. In order to solve the problem, the interval between gate electrodes should be extended, or the height of the gate electrode should be reduced. However, extending intervals between gate electrodes results in an increase in chip size and runs counter to high integration. Further, reducing the height of the gate electrode does not provide a sufficient height margin for the formation of silicate required to reduce resistance, increasing the possibility that silicate on a gate may attack a gate oxide layer or an active region, and thus, sufficient gate electrode height for a subsequent chemical mechanical polishing (CMP) process cannot be obtained.

FIG. 1 is a sectional view illustrating effects of the height of a gate electrode and a gate-to-gate space on an ion implantation angle.

Referring to FIG. 1, when the interval between gate electrodes is a, the height of the gate electrode is b, and the angle between a normal to the surface of the semiconductor substrate 10 and the path of the impurity ions is θ, a sufficient ratio of a b is required in order to employ high angle halo ion implantation. To achieve this, the interval a between gate electrodes should be sufficiently extended, or the height b of the gate electrode should be sufficiently reduced. However, reducing the height b of the gate results in the margin of the height of a gate being insufficient for the formation of silicide required to reduce resistance, and the gate oxide layer 12 or the active region may be attacked by silicide on the gate, and a gate electrode of sufficient height for a subsequent CMP process cannot be obtained. Extending the interval a between gate electrodes results in loss in a design rule, and thus the size of the chip becomes larger. This runs counter to high integration in the semiconductor manufacturing process.

SUMMARY OF THE INVENTION

To solve the above problem, it is a first object of the present invention to provide a structure of a semiconductor device including gate electrodes having a T-shaped structure comprised of first and second gate electrodes having low gate resistance and low parasitic capacitance and a halo ion-implanted region in which a short channel effect can be effectively suppressed.

It is a second object of the present invention to provide a method for manufacturing the same capable of performing high angle ion implantation without extending gate-to-gate space.

In accordance with the invention, there is provided a semiconductor device. The semiconductor device includes a first ion-implanted region formed in a semiconductor substrate, a second ion-implanted region formed at both sides of the first ion-implanted region, a halo ion-implanted region adjacent to the second ion-implanted region opposite the first ion-implanted region, a gate oxide layer formed on the semiconductor substrate, a first gate electrode formed on the gate oxide layer, a silicon nitride ($Si_3N_4$) layer formed on the semiconductor substrate and along side-walls of the gate oxide layer and the first gate electrode, an oxide layer adjacent to the silicon nitride ($Si_3N_4$) layer, opposite the first gate electrode, a second gate electrode formed on the first gate electrode, the silicon nitride ($Si_3N_4$) layer, and the oxide layer, and first spacers formed on sidewalls of the second gate electrode and the oxide layer.

In one embodiment, gate electrodes comprised of the first gate electrode and the second gate electrode have a T-shaped structure in which the width of the second gate electrode is greater than that of the first gate electrode.

The silicon nitride ($Si_3N_4$) layer formed at both sides of the first gate electrode has an L-shaped or reverse L-shaped cross-section.

In one embodiment, the gate oxide layer is formed on the semiconductor substrate between the second ion-implanted regions.

The first ion-implanted region can be formed on the semiconductor substrate in a region wider than an interval between the first spacers.

An impurity in the halo ion-implanted region has a conductivity type opposite to that of the impurity in the first and second ion-implanted regions.

The concentration of impurity in the first ion-implanted region is higher than that of the second ion-implanted region.

It is preferable that the concentration of impurity in the first ion-implanted region be $3 \times 10^{15}$~$7 \times 10^{15}$ cm$^{-2}$, and the concentration of impurity in the second ion-implanted region be $1 \times 10^{14}$~$2 \times 10^{15}$ cm$^{-2}$.

It is also preferable that the concentration of an impurity in the halo ion-implanted region be $1 \times 10^{13}$~$5 \times 10^{14}$ cm$^{-2}$.

It is also preferable that the first gate electrode be formed of polycrystalline silicon or silicon germanium (SiGe).

It is also preferable that the height of the first gate electrode be 500–1000 Å.

It is also preferable that the second gate electrode is formed of polycrystalline silicon or silicon germanium (SiGe).

It is also preferable that the height of the second gate electrode be 300–1500 Å.

It is also preferable that the silicon nitride ($Si_3N_4$) layer be formed to a thickness of 30–200 Å.

The structure may further include a third ion-implanted region formed in the semiconductor substrate between the first spacers, and a second spacer formed at the sides of the first spacers.

In accordance with the invention, there is also provided a method for manufacturing a semiconductor device. In accordance with the method, a gate oxide layer and a first gate electrode are formed on a semiconductor substrate. A source/drain extension region is formed by implanting impurity ions into the semiconductor substrate. A halo ion-implanted region is formed at both sides of the source/drain extension region by implanting impurity ions at a predetermined angle between a normal to the semiconductor substrate, by using a high angle halo ion implantation method. A silicon nitride ($Si_3N_4$) layer is formed on the semiconductor substrate on which the halo ion-implanted region is formed. An oxide layer is formed on the semiconductor substrate on which the silicon nitride ($Si_3N_4$) layer is formed. The semiconductor substrate on which the oxide layer is formed is planarized by chemical mechanical polishing to expose the first gate electrode. A second gate electrode is formed on the first gate electrode using a selective epitaxial growth method. The oxide layer is etched back to expose the silicon nitride ($Si_3N_4$) layer using the second gate electrode as an etch mask. An insulating layer for forming spacers is deposited on the semiconductor substrate, and a first spacer is formed by anisotropic dry etching. A first deep source/drain region is formed by implanting impurity ions into the semiconductor substrate.

In one embodiment, the step of forming the first spacer is performed before the step of forming the first deep source/drain region, and after the step of etching back the oxide layer. After the step of forming the first deep source/drain region, an insulating layer for forming spacers is deposited on the semiconductor substrate and a second spacer is formed by anisotropic dry etching, and a second deep source/drain region is formed by implanting impurity ions into the semiconductor substrate. The step of forming the second spacer and the step of implanting impurity ions are repeated twice or more.

The step of forming the first deep source/drain region is performed before the step of forming the second spacer, and after the step of etching back the oxide layer. After the step of forming the second spacer, a second deep source/drain region is formed by implanting impurity ions into the semiconductor substrate, and an insulating layer for forming spacers is deposited on the semiconductor substrate and a second spacer is formed by anisotropic dry etching. The step of implanting impurity ions and the step of forming the second spacer are repeated twice or more.

Before the step of forming the gate oxide layer and the first gate electrode, a device isolation region is formed on the semiconductor substrate, and impurity ions are implanted into the semiconductor substrate to control a threshold voltage.

It is preferable that the angle between a normal to the semiconductor substrate and the direction of implantation of the impurity ions be 30–80°.

In one embodiment, the height of the first gate electrode is controlled such that the maximum angle between a normal to the semiconductor substrate and the direction of implantation of the impurity ions is 30–80°. It is preferable that the height of the first gate electrode be 500–1500 Å.

It is also preferable that the first gate electrode be formed of polycrystaline silicon or silicon germanium (SiGe).

The impurity in the halo ion-implanted region has a type opposite to that of the impurity in the source/drain extension region.

The concentration of the impurity in the first deep source/drain region is higher than that of the source/drain extension region.

It is preferable that the concentration of the impurity in the source/drain extension region be $1 \times 10^{14}$~$2 \times 10^{15}$ cm$^{-2}$.

It is also preferable that the concentration of the impurity in the halo ion-implanted region be $1 \times 10^{13}$~$5 \times 10^{14 cm-2}$.

It is also preferable that the concentration of the impurity in the first deep source/drain region be $3 \times 10^{15}$~$7 \times 10^{15}$ cm$^{-2}$.

It is also preferable that the height of the second gate electrode be 300–1500 Å.

It is also preferable that the second gate electrode be formed of polycrystalline silicon or silicon germanium (SiGe).

It is also preferable that the silicon nitride ($Si_3N_4$) layer be formed to a thickness of 30–200 Å.

It is also preferable that the oxide layer be formed of high temperature oxide (HTO), middle temperature oxide (MTO), or low temperature oxide (LTO), having a high etching selectivity to the silicon nitride ($Si_3N_4$) layer.

Gate electrodes comprised of the first gate electrode and the second gate electrode have a T-shaped structure in which the width of the second gate electrode is greater than that of the first gate electrode.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

Figure 1:
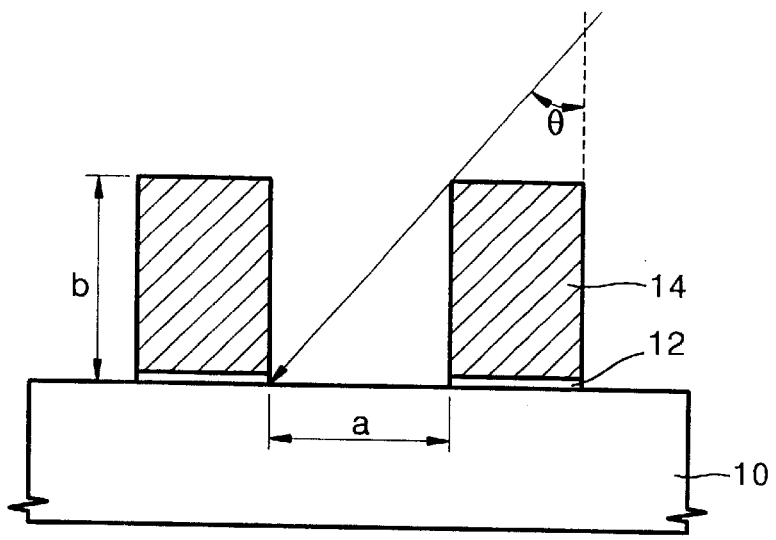
FIG. 1 is a sectional view illustrating the effects of the height of a gate electrode and gate-to-gate space on an ion implantation angle.

| < List of Reference numerals designating the major elements of the drawings > | |
|---|---|
| 100 | Semiconductor substrate |
| 102 | Gate oxide layer |
| 104 | First gate electrode |
| 106 | Source/drain extension region |
| 108 | Halo ion-implanted region |
| 110 | Silicon nitride (Si$_3$N$_4$) layer |
| 112 | Oxide Layer |
| 114 | Second gate electrode |
| 116a | First spacer |
| 118 | First deep source/drain region |
| 120 | Second spacer |
| 122 | Second deep source/drain region |

DETAILED DESCRIPTION OF THE INVENTION

The present invention will be described more fully hereinafter with reference to the accompanying drawings in which preferred embodiments of the invention are shown In the drawings, the forms of elements are exaggerated for clarity.

Figure 12:
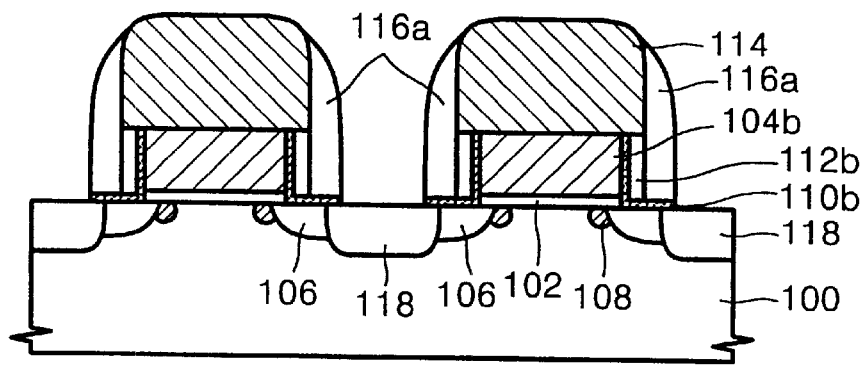
Figure 16:
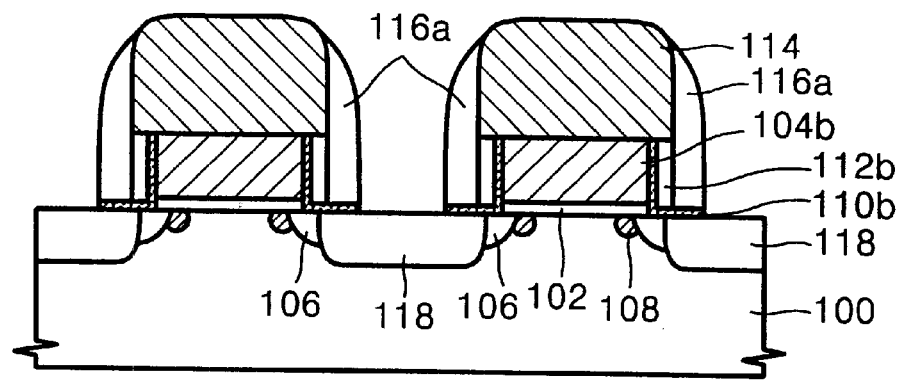

FIGS. 12 and 16 are sectional views illustrating a structure of a semiconductor device according to embodiments of the present invention.

Referring to FIGS. 12 and 16, a first ion-implanted region 118, that is, a deep source/drain region, is formed in a semiconductor substrate 100. The first ion-implanted region 118 is formed in the semiconductor substrate 100 in a region wider than an interval between first spacers 116a. A second ion-implanted region 106, that is, a source/drain extension region 106, is formed at both sides of the first ion-implanted region 118. Preferably, the concentration of impurity in the second ion-implanted region 106 is lower than in the first ion-implanted region 118. In one embodiment, the concentration of impurity in the first ion-implanted region 118 is 3×10$^{15}$~7×10$^{15}$ cm$^{-2}$, and the concentration of the impurity in the second ion-implanted region 106 is 1×10$^{14}$~2×10$^{15}$ cm$^{-2}$. Further, a halo-ion implanted region 108 is adjacent to the second ion-implanted region 106, on the opposite side from the first ion-implanted region 118. The impurity implanted into the halo ion-implanted region 108 has a type opposite to that of the impurity in the first and second ion-implanted regions 118 and 106. For example, in a case where the impurity implanted into the first and second ion-implanted regions 118 and 106 is a P-type impurity such as boron (B) and/or indium (In), the impurity implanted into the halo ion-implanted region 108 is an N-type impurity such as arsenic (As) and/or phosphorus (P). Conversely, in a case where the impurity implanted into the first and second ion-implanted regions 118 and 106 is an N-type impurity such as arsenic (As) and/or phosphorus (P), the impurity implanted into the halo ion-implanted region 108 is a P-type impurity such as boron (B) and/or indium (In). Preferably, the halo ion-implanted region 108 has impurity with low concentration. In one embodiment, the concentration of the impurity in the halo ion-implanted region 108 is 1×10$^{13}$~5×10$^{14}$ cm$^{-2}$. The halo ion-implanted region 108 is formed at the sides of the source/drain extension region 106, thereby effectively suppressing a short channel effect even with impurity of low concentration, reducing a body effect, increasing on-current, and reducing off-current. Junction capacitance can also be reduced.

A gate oxide layer 102 is formed on the semiconductor substrate 100. That is, the gate oxide layer 102 is formed on the semiconductor substrate 100 between the source/drain extension regions 106. A first gate electrode 104b is formed on the gate oxide layer 102. Preferably, the first gate electrode 104b is formed of polycrystalline silicon or silicon germanium (SiGe). In one embodiment, the first gate electrode 104b is formed to a height of 500–1000 Å. A silicon nitride (Si$_3$N$_4$) layer 110b is formed on the semiconductor substrate 100 and along side-walls of the gate oxide layer 102 and the first gate electrode 104b. The silicon nitride (Si$_3$N$_4$) layer 110b formed at both sides of the first gate electrode 104b has an L-shaped or reverse L-shaped cross-section. Preferably, the silicon nitride (Si$_3$N$_4$) layer 110b is formed to a thickness of 30–200 Å. Further, an oxide layer 112b is adjacent to the silicon nitride (Si$_3$N$_4$) layer 110b on the opposite side from the first gate electrode 104b. The oxide layer 112b is formed of high temperature oxide (HTO), middle temperature oxide (MTO), or low temperature oxide (LTO). A second gate electrode 114 is formed on the first gate electrode 104b, the silicon nitride (Si$_3$N$_4$) layer 110b, and the oxide layer 112b. Preferably, the second gate electrode 114 is formed of polycrystalline silicon or silicon germanium (SiGe). In one embodiment, the second gate electrode 114 is formed to a height of 300–1500 Å. A first spacer 116a is formed on the sidewalls of the second gate electrode 114 and the oxide layer 112b. That is, the first spacer 116a is adjacent to the second gate electrode 114 and the oxide layer 112b and is formed on the silicon nitride (Si$_3$N$_4$) layer 110b on the surface of the semiconductor substrate 100. The first spacer 116a is formed of high temperature oxide (HTO), middle temperature oxide (MTO), or low temperature oxide (LTO).

In a semiconductor device according to embodiments of the present invention, gate electrodes have a T-shaped structure comprised of the first gate electrode 104b and the second gate electrode 114. In the T-shaped gate structure, the width of a lower gate (the first gate electrode 104b) is reduced, and the width of an upper gate (the second gate electrode 114) is increased, thereby forming a wide silicide area and reducing resistance. As a result, gate capacitance can be reduced, and overlap capacitance between a gate and a source/drain extension region can be reduced.

Figure 13:
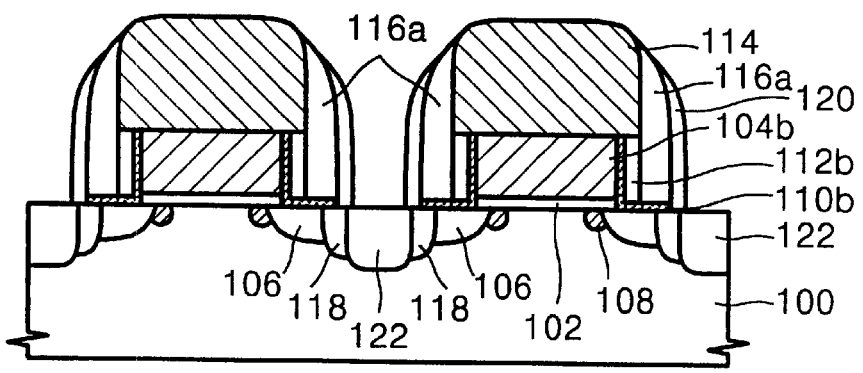
Figure 17:
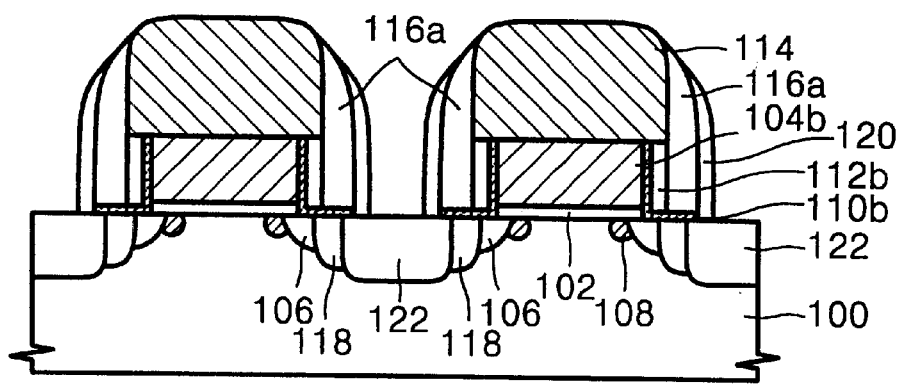

FIGS. 13 and 17 are sectional views illustrating a structure in which a third ion-implanted region and a second spacer are further formed on the semiconductor device shown in FIGS. 12 and 16.

Referring to FIGS. 13 and 17, a third ion-implanted region 122, that is, a second deep source/drain region, is formed in a semiconductor substrate 100. The third ion-implanted region 122 is formed in the semiconductor substrate 100 in a region wider than an interval between second spacers 120 to be later described. A first ion-implanted region 118 is formed at both sides of the third ion-implanted region 122. Preferably, the concentration of the impurity in the first ion-implanted region 118 is lower than in the third ion-implanted region 122. Further, a second ion-implanted region 106 is adjacent to the first ion-implanted region 118, on the opposite side to the third ion-implanted region 122. Preferably, the concentration of the impurity in the second ion-implanted region 106 is lower than in the first ion-implanted region 118. Further, a halo ion-implanted region 108 is adjacent to the second ion-implanted region 106, on the opposite side to the first ion-implanted-region 118. The impurity implanted into the halo ion-implanted region 108 has a type opposite to that of the impurity in the first, second and third ion-implanted regions 118, 106, and 122. For example, in a case where the impurity implanted into the first, second, and third ion-implanted regions 118, 106, and 122 is a P-type impurity such as boron (B) and/or indium (In), the impurity implanted into the halo ion-implanted region 108 is an N-type impurity such as arsenic (As) and/or phosphorus (P). Conversely, in a case where the impurity implanted into the first, second, and third ion-implanted regions 118, 106, and 122 is an N-type impurity such as arsenic (As) and/or phosphorus (P), the impurity implanted into the halo ion-implanted region 108 is a P-type impurity such as boron (B) and/or indium (In). The halo ion-implanted region 108 is formed at the sides of the source/drain extension region 106, thereby effectively suppressing a short channel effect even with impurity of low concentration, reducing a body effect, increasing on-current, and reducing off-current. As a result, junction capacitance can be reduced. A second spacer 120 is further formed on the sidewalls of the gate electrodes; otherwise, the gate structure on the semiconductor substrate 100 is the same as the T-shaped gate structure shown in FIGS. 13 and 16.

Hereinafter, a method for manufacturing a semiconductor device according to embodiments of the present invention will be described.

Figure 2:
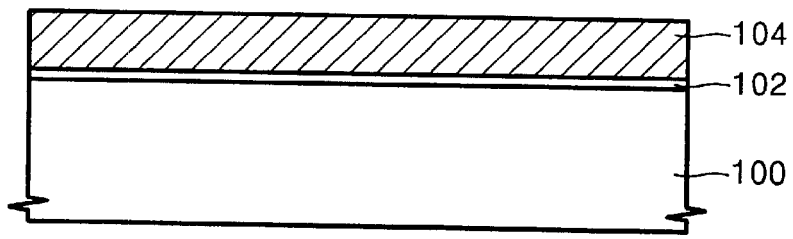
FIGS. 2 through 13 are sectional views illustrating a method for manufacturing a semiconductor device according to a first embodiment of the present invention.

FIGS. 2 through 13 are sectional views illustrating a method for manufacturing a semiconductor device according to a first embodiment of the present invention. Referring to FIG. 2, an active region is defined on a semiconductor substrate 100, and a field oxide layer (not shown) for electrically isolating the active region is formed. The field oxide layer can be formed by a local oxidation of silicon (LOCOS) process or a shallow trench isolation process. Subsequently, ion implantation is performed on the semiconductor substrate 100 to control a threshold voltage.

Next, a gate oxide layer 102 is formed on the semiconductor substrate 100. Subsequently, a first gate material 104 is deposited on the gate oxide layer 102. Preferably, the first gate material 104 is polycrystalline silicon or silicon germanium (SiGe). If the first gate material 104 is too thick, high angle ion implantation cannot be performed in a subsequent halo ion implantation process. If the first gate material 104 is too thin, the margin of height of the gate is not sufficient in the formation of silicide required to reduce resistance, increasing the possibility that silicide on a gate may attack the gate oxide layer 102 or an active region, and thus, sufficient thickness for a subsequent chemical mechanical polishing (CMP) process cannot be obtained. Thus, the thickness of deposition of the first gate material 104 should be properly determined in consideration of these problems. In one embodiment, the first gate material 104 is deposited to a thickness of 500–1500 Å.

Figure 3:
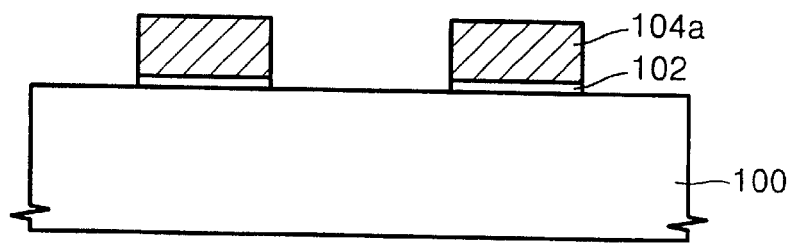

Referring to FIG. 3, the first gate material 104 and the gate oxide layer 102 are patterned. A conventional photolithographic process is used in patterning, and a first gate electrode 104a is formed by patterning.

Figure 4:
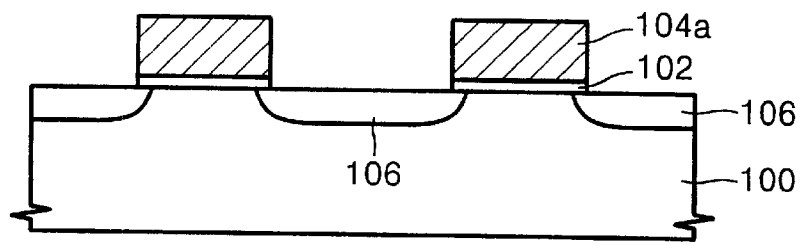

Referring to FIG. 4, a source/drain extension region 106 is formed by implanting impurity ions into the semiconductor substrate 100 on which the first gate electrode 104a is formed. The source/drain extension region 106 is ion-implanted with impurity of a type opposite to that of the doping of the semiconductor substrate 100. For example, in a case where the semiconductor substrate 100 is doped with an N-type impurity, the source/drain extension region 106 is ion-implanted with a P-type impurity such as boron (B) and/or boron fluoride ($BF_2$). Conversely, in a case where the semiconductor substrate 100 is doped with a P-type impurity, the source/drain extension region 106 is ion-implanted with an N-type impurity such as arsenic (As) and/or phosphorus (P). In one embodiment, the concentration of the impurity in the source/drain extension region 106 is $1\times10^{14}$~$2\times10^{15}$ $cm^{-2}$.

Figure 5:
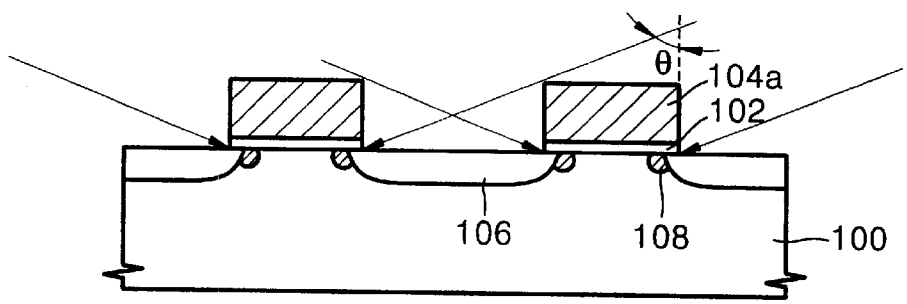

Referring to FIG. 5, a halo ion-implanted region 108 is formed on the semiconductor substrate 100 on which the source/drain extension region 106 is formed, by using a high angle halo ion implantation method. The halo ion-implanted region 108 is formed at the sides of the source/drain extension region 106. In such a case, a short channel effect can be effectively suppressed, and a body effect can be reduced, thereby increasing on-current and reducing off-current,.even with impurity of low concentration. Further, junction capacitance can be reduced, and variation in gate length can be reduced. Preferably, high angle halo ion implantation is performed such that an angle θ between a normal to the semiconductor substrate 100 and the path of the impurity ions is 30–80°. The halo ion-implanted region 108 is ion-implanted with an impurity of a type opposite to that of the doping of the source/drain extension region 106. For example, in a case where the source/drain extension region 106 is doped with an N-type impurity, the halo ion-implanted region 108 is ion-implanted with a P-type impurity such as boron (B) and/or indium (In). Conversely, in a case where the source/drain extension region 106 is doped with a P-type impurity, the halo ion-implanted region 106 is ion-implanted with an N-type impurity such as arsenic (As) and/or phosphorus (P). Preferably, the halo ion-implanted region 108 is ion-implanted with an impurity of low concentration. In a case where the concentration of the impurity in the halo ion-implanted region 108 is too high, junction capacitance and junction leakage current may be increased, and on-current may be reduced. In one embodiment, the concentration of the impurity of the halo ion-implanted region 108 is $1\times10^{13}$~$5\times10^{14}$ $cm^{-2}$.

Figure 6:
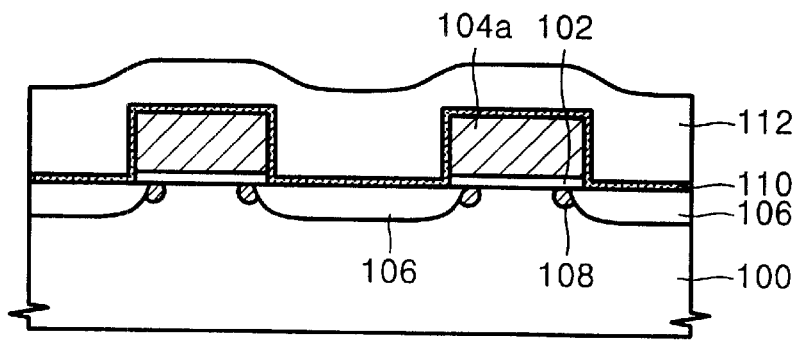

Referring to FIG. 6, a silicon nitride ($Si_3N_4$) layer 110 is formed conformably along a step on the semiconductor substrate 100 on which the halo ion-implanted region 108 is formed. In one embodiment, the silicon nitride ($Si_3N_4$) layer 110 is formed to a thickness of 30–200 Å.

Subsequently, an oxide layer 112 having a high etching selectivity to the silicon nitride ($Si_3N_4$) layer 110 is formed on the silicon nitride ($Si_3N_4$) layer 110. The oxide layer 112 is formed of high temperature oxide (HTO), middle temperature oxide (MTO), or low temperature oxide (LTO). In one embodiment, the oxide layer 112 is formed to a thickness of 500–2500 Å.

Figure 7:
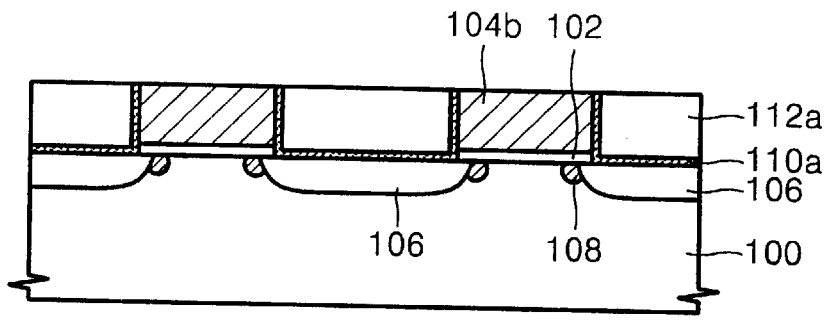

Referring to FIG. 7, the semiconductor substrate 100 on which the oxide layer 112 is formed is planarized by chemical mechanical polishing (CMP) so as to expose the top of the first gate electrode 104a. The first gate electrode 104a is recessed to a predetermined thickness by CMP. In one embodiment, the height of the first gate electrode 104b after recession is 500–1000 Å.

Figure 8:
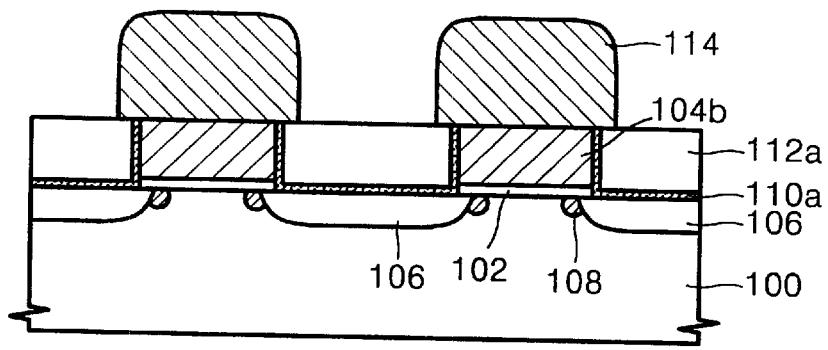

Referring to FIG. 8, a second gate material is grown on the first gate electrode 104b by using a selective epitaxial growth method to form a second gate electrode 114. Preferably, the second gate material is formed of polycrystalline silicon or silicon germanium (SiGe). In one embodiment, the second gate material is grown to a thickness of 300–1500 Å. The second gate electrode 114 is formed on the first gate electrode 104b, and thus, gate electrodes of the present invention have a T-shaped structure comprised of the first gate electrode 104b and the second gate electrode 114.

Figure 9:
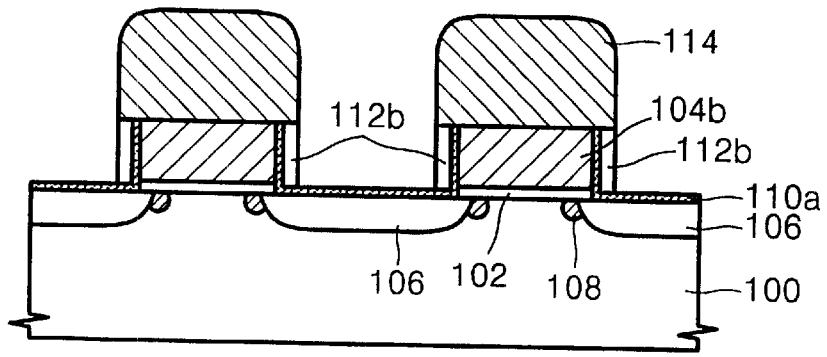

Referring to FIG. 9, an oxide layer 112a (FIGS. 7 and 8) is etched back using the second gate electrode 114 as an etch mask. That is, the entire surface of the semiconductor substrate 100 on which the second gate electrode 114 is formed is dry etched without forming a photo mask layer. The etching leaves an oxide layer 112b remaining only under the second gate electrode 114, adjacent to a silicon nitride ($Si_3N_4$) layer 110a (FIGS. 7 and 8). The silicon nitride ($Si_3N_4$) layer 110a, having an etching selectivity to the oxide layer 112a, serves as an etch stopper for etching.

Figure 10:
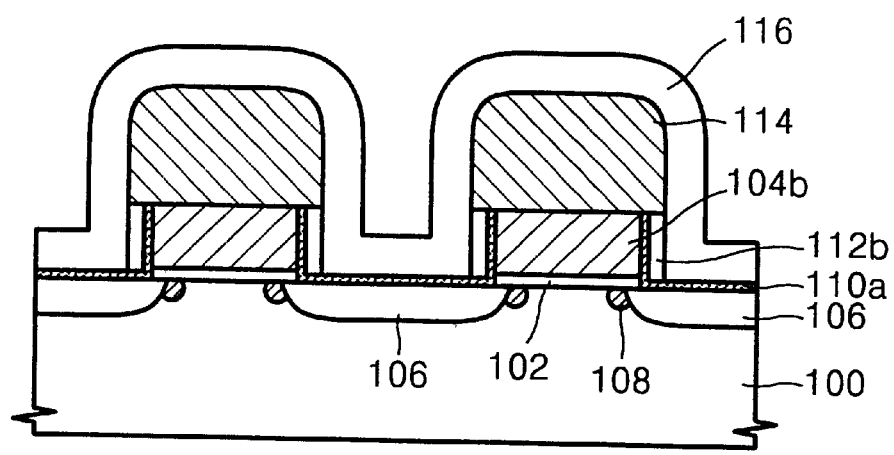

Referring to FIG. 10, an insulating layer 116 for forming spacers is formed on the semiconductor substrate 100. The insulating layer 116 for forming spacers is formed of high temperature oxide (HTO), middle temperature oxide (MTO), or low temperature oxide (LTO). In one embodiment, the insulating layer 116 for forming spacers is formed of a thickness of 300–2500 Å.

Figure 11:
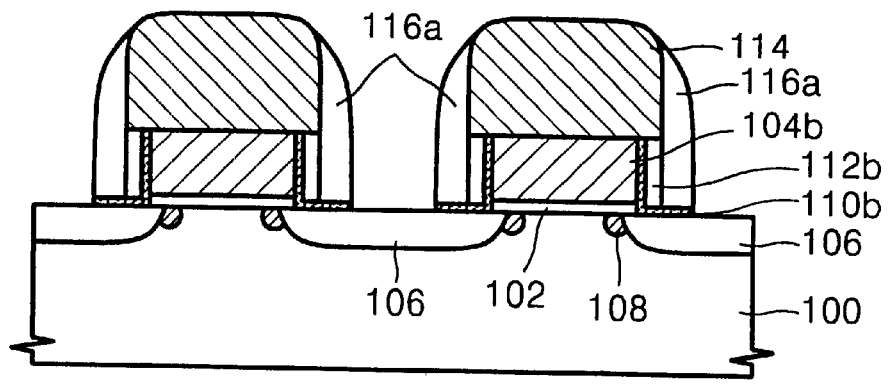

Referring to FIG. 11, the insulating layer 116 for forming spacers is anisotropically dry etched to form a first spacer 116a. The silicon nitride layer ($Si_3N_4$) 110a which is formed under the insulating layer 116 for forming spacers is also etched, thereby exposing a predetermined region of the semiconductor substrate 100.

Referring to FIG. 12, impurity ions are implanted into the semiconductor substrate 100 on which the first spacer 116a is formed, thereby forming a first deep source/drain region 118. The first deep source/drain region 118 is ion-implanted with an impurity of a type opposite to that of the doping of the semiconductor substrate 100. For example, in a case where the semiconductor substrate 100 is doped with an N-type impurity, the first deep source/drain region 118 is ion-implanted with a P-type impurity such as boron (B) and/or boron fluoride ($BF_2$). Conversely, in a case where the semiconductor substrate 100 is doped with a P-type impurity, the first deep source/drain region 118 is ion-implanted with an N-type impurity such as arsenic (As) and/or phosphorus (P). Preferably, the concentration of the impurity in the first deep source/drain region 118 is higher than the concentration of the impurity in the source/drain extension region 106. In one embodiment, the concentration of the impurity in the first deep source/drain region 118 is $3 \times 10^{15} \sim 7 \times 10^{15}$ $cm^{-2}$.

The first spacer 116a and the first deep source/drain region 118 are formed sequentially, as shown in FIG. 12. However, as shown in FIG. 13, a second spacer 120 and a second deep source/drain region 122 can be further formed. That is, after an insulating layer for forming spacers is formed on the semiconductor substrate 100, the insulating layer for forming spacers is anisotropically dry etched to form the second spacer 120, and the semiconductor substrate 100 is ion-implanted, thereby forming the second deep source/drain region 122. Preferably, the concentration of the impurity in the second deep source/drain region 122 is higher than the concentration of the impurity of the first deep source/drain region 118. The process of forming spacers and deep source/drain regions is repeated twice or more, and thus, multiple spacers (not shown) and multiple deep source/drain regions (not shown) can be formed.

FIGS. 14 through 17 are sectional views illustrating a method for manufacturing a semiconductor device according to a second embodiment of the present invention.

Steps of the first embodiment shown in FIGS. 2 through 9 are the same as those of the second embodiment. Thus, the steps described in detail with reference to FIGS. 2 through 9 in the first embodiment will be not described in detail for the second embodiment, but will be summarized. First, an active region is defined on the semiconductor substrate 100, and a field oxide layer (not shown) for electrically isolating the active region is formed. Next, the gate oxide layer 102 and the first gate material 104 are formed on the semiconductor substrate 100 and then patterned to form the first gate electrode 104a. Subsequently, impurity ions are implanted into the semiconductor substrate 100 to form the source/drain extension region 106. Next, the halo ion-implanted region 108 is formed on the semiconductor substrate 100 using a high angle halo ion implantation method. Next, the silicon nitride ($Si_3N_4$) layer 110 and the oxide layer 112 are formed on the semiconductor substrate 100, and the semiconductor substrate 100 is planarized by chemical mechanical polishing (CMP) so as to expose the top of the first gate electrode 104a. Next, the second gate material is grown on the first gate electrode 104b using a selective epitaxial growth method to form the second gate electrode 114. Next, the oxide layer 112a is etched back using the second gate electrode 114 as an etch mask.

Figure 14:
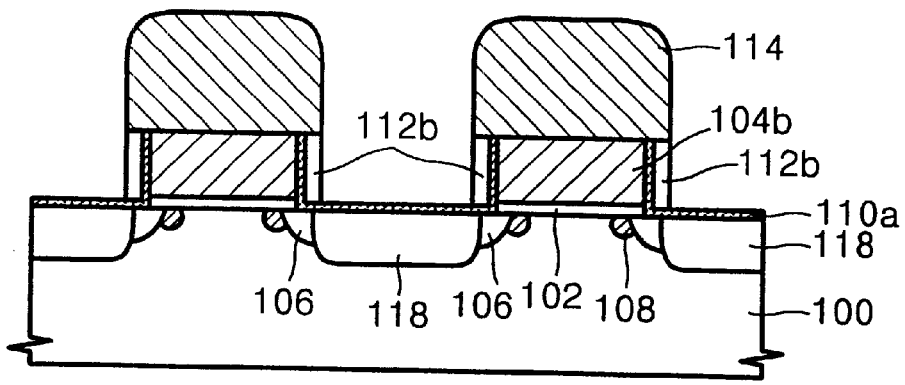
FIGS. 14 through 17 are sectional views illustrating a method for manufacturing a semiconductor device according to a second embodiment of the present invention.

Referring to FIG. 14, impurity ions are implanted into the semiconductor substrate 100 on which the oxide layer 112b is etched back, thereby forming a first deep source/drain region 118. The first deep source/drain region 118 is ion-implanted with an impurity of a type opposite to that of the doping of the semiconductor substrate 100. For example, in a case where the semiconductor substrate 100 is doped with an N-type impurity, the first deep source/drain region 118 is ion-implanted with a P-type impurity such as boron (B) and/or boron fluoride ($BF_2$). Conversely, in a case where the semiconductor substrate 100 is doped with a P-type impurity, the first deep source/drain region 118 is ion-implanted with an N-type impurity such as arsenic (As) and/or phosphorus (P). Preferably, the concentration of the impurity in the first deep source/drain region 118 is higher than the concentration of the impurity in the source/drain extension region 106. In one embodiment, the concentration of the impurity in the first deep source/drain region 118 is $3 \times 10^{15} \sim 7 \times 10^{15}$ $cm^{-2}$.

Figure 15:
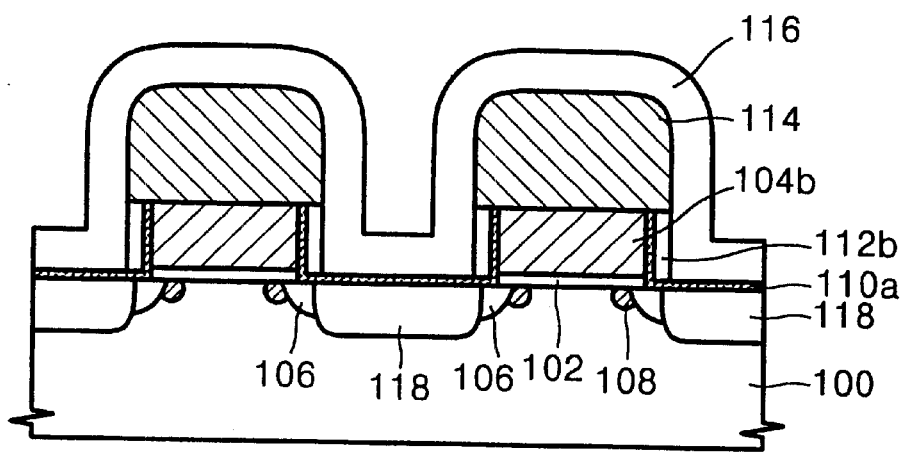

Referring to FIG. 15, an insulating layer 116 for forming spacers is formed on the semiconductor substrate 100 on which the first deep source/drain region 118 is formed. The insulating layer 116 for forming spacers is formed of high temperature oxide (HTO), middle temperature oxide (MTO), or low temperature oxide (LTO). Preferably, the insulating layer 116 for forming spacers is formed to a thickness of 300–2500 Å.

Referring to FIG. 16, the insulating layer 116 for forming spacers is anisotropically dry etched to form a first spacer 116a. The silicon nitride layer ($Si_3N_4$) 110a which is formed under the insulating layer 116 for forming spacers is also etched, thereby exposing a predetermined region of the semiconductor substrate 100.

A first spacer 116a and a first deep source/drain region 118 are formed as shown in FIG. 16. However, as shown in FIG. 17, a second spacer 120 and a second deep source/drain region 122 can be further formed. That is, impurity ions are implanted into the semiconductor substrate 100 to form the second deep source/drain region 122, and then an insulating layer for forming spacers is formed on the semiconductor substrate 100, and then the insulating layer for forming spacers is anisotropically dry etched to form the second spacer 120. Preferably, the concentration of the impurity in the second deep source/drain region 122 is higher than the concentration of the impurity of the first deep source/drain region 118. Further, the process of forming spacers and deep source/drain regions can be repeated twice or more, and thus, multiple spacers (not shown) and multiple deep source/drain regions (not shown) can be formed.

In the structure of a semiconductor device according to the present invention, gate electrodes have a T-shaped structure comprised of the first gate electrode and the second gate electrode. Thus, the width of a lower gate (the first gate electrode) is reduced, and the width of an upper gate (the second gate electrode) is increased, thereby forming wide silicide and reducing resistance. As a result, gate capacitance can be also reduced, and overlap capacitance between the gate and the source/drain extension region can be also reduced.

In the prior art, as semiconductor devices become highly integrated, due to limitations in gate-to-gate space, halo ion implantation at more than a predetermined angle was impossible, and thus the advantages of high angle ion implantation were not taken. However, in the present invention, the first gate electrode is formed lower than in the prior art, then high angle halo ion implantation is performed, and then the second gate electrode is formed, thereby allowing high angle halo ion implantation without extending gate-to-gate space.

Further, in the method for manufacturing a semiconductor device according to the present invention, impurity ions are selectively implanted into the sides of the source/drain extension region to form a halo ion-implanted region, thereby effectively suppressing a short channel effect. The halo ion-implanted region is formed with an impurity of low concentration, thereby reducing a body effect, increasing on-current, and reducing off-current. Junction capacitance is also reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
   a first ion-implanted region formed in a semiconductor substrate;
   a second ion-implanted region formed at both sides of the first ion-implanted region;
   a halo ion-implanted region adjacent to the second ion-implanted region opposite the first ion-implanted region;
   a gate oxide layer formed on the semiconductor substrate;
   a first gate electrode formed on the gate oxide layer;
   a silicon nitride ($Si_3N_4$) layer formed on the semiconductor substrate and along side-walls of the gate oxide layer and the first gate electrode;
   an oxide layer adjacent to the silicon nitride ($Si_3N_4$) layer opposite the first gate electrode;
   a second gate electrode formed on the first gate electrode, the silicon nitride ($Si_3N_4$) layer, and the oxide layer; and
   first spacers formed on sidewalls of the second gate electrode and the oxide layer.

2. The semiconductor device as claimed in claim 1, wherein gate electrodes comprised of the first gate electrode and the second gate electrode have a T-shaped structure in which the width of the second gate electrode is greater than that of the first gate electrode.

3. The semiconductor device as claimed in claim 1, wherein the silicon nitride ($Si_3N_4$) layer formed at both sides of the first gate electrode has one of an L-shaped and reverse L-shaped cross-section.

4. The semiconductor device as claimed in claim 1, wherein the gate oxide layer is formed on the semiconductor substrate between the second ion-implanted regions.

5. The semiconductor device as claimed in claim 1, wherein the first ion-implanted region is formed on the semiconductor substrate in a region wider than an interval between the first spacers.

6. The semiconductor device as claimed in claim 1, wherein an impurity in the halo ion-implanted region has a conductivity type opposite to that of the impurity in the first and second ion-implanted regions.

7. The semiconductor device as claimed in claim 1, wherein the concentration of impurity in the first ion-implanted region is higher than that of the second ion-implanted region.

8. The semiconductor device as claimed in claim 7, wherein the concentration of impurity in the first ion-implanted region is $3\times10^{15}\sim7\times10^{15}$ cm$^{-2}$, and the concentration of impurity in the second ion-implanted region is $1\times10^{14}\sim2\times10^{15}$ cm$^{-2}$.

9. The semiconductor device as claimed in claim 1, wherein the concentration of an impurity in the halo ion-implanted region is $1\times10^{13}\sim5\times10^{14}$ cm$^{-2}$.

10. The semiconductor device as claimed in claim 1, wherein the first gate electrode is formed of at least one of polycrystalline silicon and silicon germanium (SiGe).

11. The semiconductor device as claimed in claim 1, wherein the height of the first gate electrode is 500–1000 Å.

12. The semiconductor device as claimed in claim 1, wherein the second gate electrode is formed of at least one of polycrystalline silicon and silicon germanium (SiGe).

13. The semiconductor device as claimed in claim 1, wherein the height of the second gate electrode is 300–1500 Å.

14. The semiconductor device as claimed in claim 1, wherein the silicon nitride ($Si_3N_4$) layer is formed to a thickness of 30–200 Å.

15. The semiconductor device as claimed in claim 1, further comprising:
   a third ion-implanted region formed in the semiconductor substrate between the first spacers; and
   a second spacer formed at the sides of the first spacers.

* * * * *